United States Patent [19]

Ihara

[11] Patent Number: 5,170,072

[45] Date of Patent: Dec. 8, 1992

[54] BUFFER DEVICE HAVING A BOOSTER CIRCUIT FOR A SEMICONDUCTOR MEMORY DEVICE

[75] Inventor: Makoto Ihara, Tenri, Japan

[73] Assignee: Sharp Kabushiki Kaisha, Osaka, Japan

[21] Appl. No.: 631,731

[22] Filed: Dec. 20, 1990

[30] Foreign Application Priority Data

Dec. 25, 1989 [JP] Japan .................................. 1-335328

[51] Int. Cl.$^5$ ........................................ H03K 19/0175
[52] U.S. Cl. ..................................... 307/264; 307/475
[58] Field of Search ............... 307/443, 571, 572, 577, 307/578, 584, 475, 264, 480, 481; 365/230.06, 203

[56] References Cited

U.S. PATENT DOCUMENTS

| 4,583,203 | 4/1986 | Monk | 307/578 |
|---|---|---|---|
| 4,612,462 | 9/1986 | Asano et al. | 307/482 |
| 4,633,102 | 12/1986 | Childers | 307/354 |
| 4,639,622 | 1/1987 | Goodwin et al. | 307/482 |
| 4,724,340 | 2/1988 | Sood | 307/481 |
| 4,769,791 | 9/1988 | Liou et al. | 365/203 |
| 4,881,201 | 11/1989 | Sato et al. | 365/189.09 |
| 4,905,314 | 2/1990 | Kato et al. | 307/578 |
| 4,982,113 | 1/1991 | Jinbo | 307/296.2 |
| 4,982,117 | 1/1991 | Matsuzaki et al. | 307/486 |
| 4,985,644 | 1/1991 | Okihara et al. | 307/443 |
| 4,996,669 | 2/1991 | Endoh et al. | 365/189.01 |
| 5,003,205 | 3/1991 | Kohda et al. | 307/443 |
| 5,010,259 | 4/1991 | Inoue et al. | 307/578 |
| 5,017,803 | 5/1991 | Yoshida | 307/571 |
| 5,056,062 | 10/1991 | Kuwabara et al. | 365/230.06 |

OTHER PUBLICATIONS

"Design For CMOS VLSI", Apr. 25, 1989, pp. 190-192.

"Semiconductor MOS Memories And Their Applications", Aug. 30, 1990, pp. 101-102.

"Dictionary Of LSI's", Jul. 30, 1988.

Sekino et al.: "Study of data output buffer"—The Spring Nation-wide Assembly of the Institute of Electronics, Information and Communication Engineers, 1988—pp. 1-3.

Primary Examiner—Andrew J. James
Assistant Examiner—Sinh Tran
Attorney, Agent, or Firm—Nixon & Vanderhye

[57] ABSTRACT

A buffer device having a booster circuit for a semiconductor memory device offers a solution to a deficient boost operation of the booster circuit due to a skew in an address signal. The buffer device has an address transition signal output circuit for outputting a HIGH signal for a specified time when detecting transition of an address signal, and a switching circuit for outputting to the booster circuit, in accordance with output from the address transition signal output circuit, either a data signal expressing data read from an address specified by the address signal or a precharge signal of a specified time length. The switching circuit, when receiving a HIGH signal from the address transition signal output circuit, outputs the precharge signal, and when receiving a LOW signal, outputs the data signal. The booster circuit boosts the data signal to a specified level when the data signal is HIGH. However, the booster circuit stops a boost operation and is precharged when the precharge signal is inputted. A transistor circuit is connected with the booster circuit for bringing, in response to output from the booster circuit, an electric potential of an output terminal of the buffer device and therefore of the semiconductor memory device to a specified high or low level in accordance with the output level from the booster circuit.

10 Claims, 4 Drawing Sheets

BUFFER DEVICE HAVING A BOOSTER CIRCUIT FOR A SEMICONDUCTOR MEMORY DEVICE

BACKGROUND OF THE INVENTION

The present invention relates to an output buffer device including a booster circuit for semiconductor memory devices.

A conventional buffer device of such a kind is shown in FIG. 4. The buffer circuit, which is incorporated in a semiconductor memory device, has a pull-up transistor 1, a pull-down transistor 2, and a booster circuit 3. When a signal S2 of a HIGH level is inputted to an input terminal 6 of the pull-up transistor 1, an output terminal 4 of the buffer device is pulled up or charged up to a potential of a power source. Also, when a signal #S1 of a HIGH level is inputted to an input terminal 7 of the pull-down transistor 2, the output terminal 4 is pulled down to a potential of a ground. In addition, when a signal S1 of a HIGH level is inputted to an input terminal 8 of the booster circuit 3, a boosted HIGH signal S2 is outputted from an output terminal 9 of the booster circuit 3, and when a signal S1 of a LOW level is inputted to the input terminal 8, a LOW signal S2 is outputted from the output terminal 9. The input terminal 8 of the booster circuit 3 and the input terminal 7 of the pull-down transistor 2 are connected by means of an inverter 5. Thus, a data signal S1 applied to the input terminal 8 of the booster circuit 3 and a data signal #S1 applied to the input terminal 7 of the pull-down transistor 2 are mutually inverse.

The buffer device in the semiconductor memory device functions as described below. It is assumed in this description that data stored in data memory area (not shown in the figure) of the semiconductor memory device has a value of 1 at address (1,1), 0 at address (0,1), and 1 at address (0,0). The data stored in addresses (1,1) and (0,0) in this semiconductor memory device will be sequentially read and outputted from the output terminal 4.

First, as shown in FIG. 5 (a), when address signals A0 and A1 are both HIGH, the data "1" is read from address (1,1), and a HIGH-level signal S1 as shown in FIG. 5 (b) and expressing the data value "1" is inputted to the booster circuit 3 and the inverter 5. Thus, a HIGH signal S2 boosted by the booster circuit 3 as shown in FIG. 5 (c) is inputted to the input terminal 6 of the pull-up transistor 1. Also, a LOW signal #S1, resulting from inversion of the signal S1 by the inverter 5, is inputted to the input terminal 7 of the pull-down transistor 2. As a result, an output electric current of the pull-up transistor 1 increases, and the output terminal 4 of the buffer device, i.e., of the semiconductor memory device is rapidly charged. Electric potential of the output terminal 4 is then pulled up to a HIGH level, that is, a level of the power source, as shown in FIG. 5 (d).

Next, when both address signals A0 and A1 change to a LOW level, the data "1" is read from address (0,0), and a HIGH signal S1 as shown in FIG. 5 (b) and corresponding to the data value "1" is inputted to the booster circuit 3 and the inverter 5. The electric potential of the output terminal 4 is then pulled up to the power source level as when both address signals A0 and A1 are HIGH.

However, when the address signals are skewed, i.e., when there is a slight difference in the transition timing of the address signal A0 and address signal A1 from a HIGH to a LOW level as shown in FIG. 5 (a), and there is a resulting transient period in which the address signal A0 is LOW and the address signal A1 is HIGH, the following problems result.

Specifically, when the address signals are skewed as described above, the data "0" is transiently read from address (0,1) as shown in FIG. 5 (b). As a result, a data signal S1 inputted to the booster circuit 3 has a LOW transient pulse P inserted between the signal S1 of a HIGH level corresponding to the data "1" read from address (1,1) and the signal S1 of a HIGH level corresponding to the data "1" read from address (0,0).

A symbol T in FIG. 5 (b) indicates a time lag between the address skew occurring in the transition to a LOW level and inputting of the LOW transient pulse P in the signal S1 to the buffer circuit.

When the transient LOW pulse P as described above is inputted, boosting of the signal S1 inputted after the LOW pulse P becomes insufficient, and the booster circuit 3 is unable to maintain a normal boost level in the output signal S2 from the output terminal 9 as shown in FIG. 5 (c)(i). Another possibility is that due to the booster circuit construction the signal S1 is not boosted when it should be boosted, and the level of the output signal S2 from the output terminal 9 remains LOW as shown in FIG. 5 (c)(ii). The problem is therefore that, as shown in FIG. 5 (d)(i) and (d)(ii), the level corresponding to the data "1" read from address (0,0) at the output terminal 4 is lower than a specified pull-up level.

SUMMARY OF THE INVENTION

An object of the present invention is therefore to provide a buffer device for a semiconductor memory device that is able to reliably pull up electric potential of an output terminal of the buffer device, and therefore of the semiconductor memory device, to a specified high level even when a skew occurs in address signals and a LOW transient pulse is thus inserted to a signal indicative of data read from a memory area of the semiconductor memory device.

FIG. 1 shows a concept of the present invention. As shown in FIG. 1, a buffer device of the present invention, which is to be incorporated in a semiconductor memory device wherein data read from an address specified by an address signal is outputted from an output terminal 12 of the buffer device, has a transistor circuit 11, booster circuit 13, switching circuit 14, and address transition signal output circuit 15.

The address transition signal output circuit 15 receives an address signal and outputs an address transition signal of a predetermined level when detecting transition of the address signal. The switching circuit 14 receives output from the address transition signal output circuit and a signal corresponding to a data signal indicative of data read from an address specified by said address signal, and outputs a precharge signal of a specified time length when the address transition signal is inputted from the address transition signal output circuit, and outputs the data signal when the address transition signal is not inputted. The booster circuit 13 is connected with the switching circuit for receiving output from the switching circuit to boost said data signal to a predetermined level when the data signal is HIGH, and output a boosted data signal, while to stop the boost operation and be precharged when the precharge signal is inputted from the switching circuit to the booster circuit. The transistor circuit 11 is connected with the booster circuit for bringing, in response to output from the booster circuit, an electric potential of said output terminal of the buffer device to a specified high or low level in accordance with the output from the booster circuit.

An address signal is inputted to the address transition signal output circuit. When it is detected that the address signal has been changed by the address transition signal output circuit, an address transition signal of a predetermined level is output. This address transition signal is inputted to the switching circuit, and the data signal representing the data read from the address specified by the address signal is also inputted to the switching circuit. When the address transition signal of the predetermined level is inputted, the switching circuit outputs a precharge signal of a specified time length, and when the address transition signal of the predetermined level is not inputted, the switching circuit outputs the data signal.

Thus, when the data signal from the switching circuit is inputted to the booster circuit, the booster circuit boosts the data signal and outputs the boosted signal. When the precharge signal is inputted to the booster circuit from the switching circuit, the booster circuit stops the boost operation and is precharged. Then, when the boosted signal from the booster circuit is inputted to the transistor circuit, the potential of the output terminal of the buffer device is pulled up or pulled down by the transistor circuit based on the boosted signal.

Thus, when the address signal level is changed, the data signal inputted to the booster circuit is masked a predetermined period only, during which the booster circuit is precharged.

BRIEF DESCRIPTION OF DRAWINGS

The present invention will become more fully understood from the detailed description given hereinbelow and the accompanying drawings which are given by way of illustration only, and thus are not limitative of the present invention, and wherein.

DETAILED DESCRIPTION OF PREFERRED EMBODIMENTS

Figure 1:
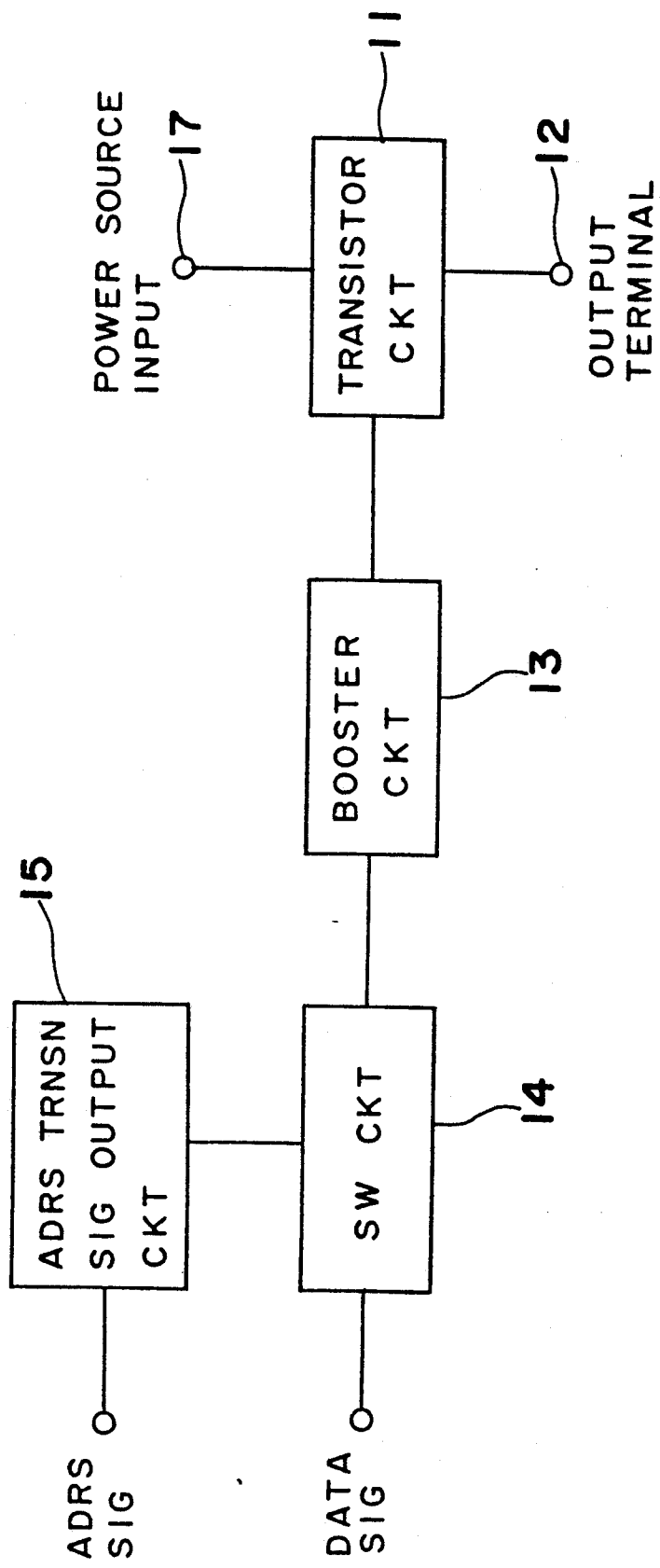
FIG. 1 shows the concept of the present invention.
Figure 2:
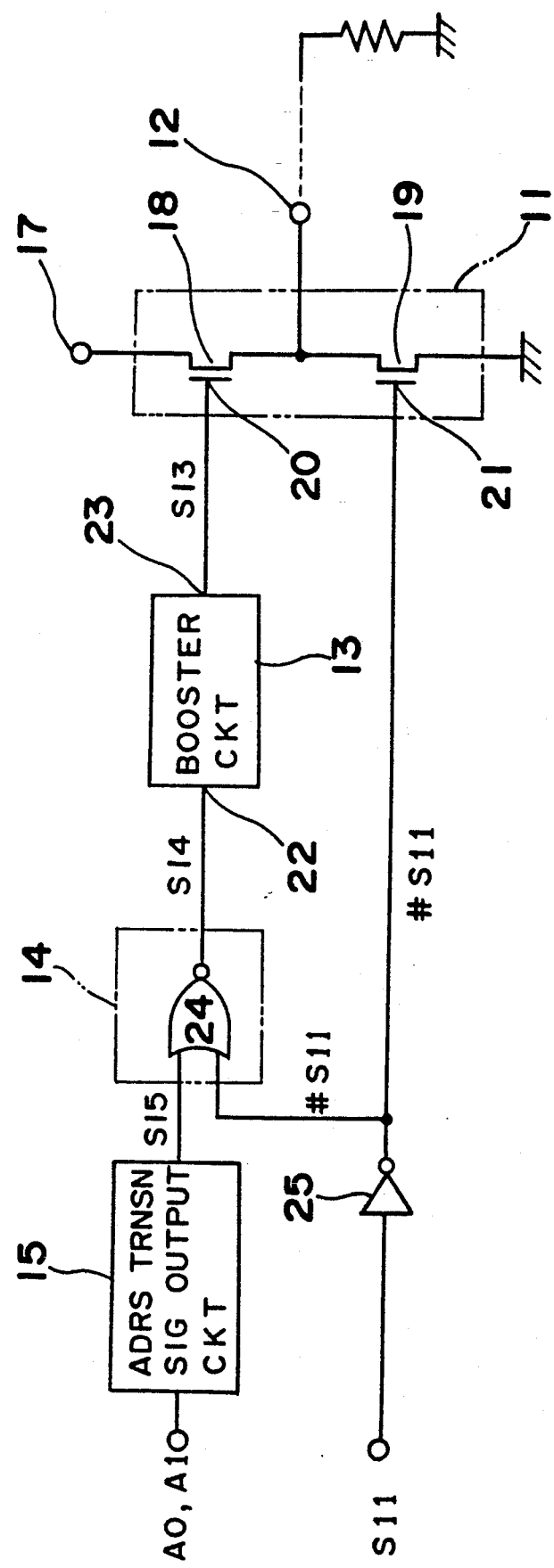
FIG. 2 is a circuit diagram of a buffer device according to an embodiment of the present invention.

FIG. 2 is a circuit diagram of a buffer device according to an embodiment of the present invention. This buffer device is incorporated in a semiconductor device (not shown).

As shown in FIG. 2, the buffer device has a transistor circuit 11, a booster circuit 13, a switching circuit 14, an address transition signal output circuit 15, and an inverter 25. Reference numeral 12 and 17 indicate an output terminal and a power source input terminal of the buffer device, and therefore, of the semiconductor memory device as well.

Booster circuit 13 and address transition signal output signal 15 may be of conventional design. For example, a conventional booster circuit which may be used in the present invention may be of the type disclosed on pages 190-192 in "Design for CMOS VLSI," published on Apr. 25, 1989. A number of conventional address transition circuits could be used including those shown in U.S. Pat. No. 4,633,102 and 4,769,791. Those skilled in the art will of course recognize that these particular circuits are exemplary only and that numerous other booster and address transition circuits could be used in the present invention.

The transistor circuit 11 consists of a pull-up transistor 18 and a pull-down transistor 19. When a HIGH signal is inputted from the booster circuit 13 to an input terminal 20 of the pull-up transistor 18, the pull-up transistor 18 is turned on to electrically connect the output terminal 12 with a power source input terminal 17. When a HIGH signal is inputted through the inverter 25 to an input terminal 21 of the pull-down transistor, the pull-down transistor 19 is turned on to electrically connect the output terminal 12 with a ground.

The booster circuit 13 has an input terminal 22 and an output terminal 23. The booster circuit 13 boosts an input signal when the input signal is of a HIGH level. Therefore, the booster circuit 13 outputs a boosted HIGH signal from the output terminal 23 when a HIGH signal is inputted to the input terminal 22, and outputs a LOW signal from the output terminal 23 when a LOW signal is inputted to the input terminal 22.

The switching circuit 14 is constituted from a NOR gate 24. To one input terminal of the NOR gate 24 is inputted an output signal, namely, an address transition signal S15, from the address transition signal output circuit 15, and to the other input terminal of the NOR gate 24 is inputted a data signal #S11 inverted by the inverter 25. When the address transition signal S15 from the address transition signal output circuit 15 is LOW, the NOR gate 24 outputs an inverted signal of the output signal #S11 from the inverter 25 as a signal S14. However, when the address transition signal S15 from the address transition signal output circuit 15 is HIGH, the NOR gate 24 outputs a LOW signal (which functions as a precharge signal to the booster circuit 13 as will be described below) as a signal S14 whether a data signal S11 expressing data read from a data storage memory (not shown in the figure) of the semiconductor memory device is HIGH or LOW. In other words, the inverter 25 is used to enable the NOR gate 24 to output a signal S14 with the same level as the data signal S11 inputted to the inverter 25 when the address transition signal S15 is LOW. Thus, the switching circuit 14 selects either the precharge signal or the data signal S11 based on the level of the address transition signal S15 from the address transition signal output circuit 15, and outputs the selected signal S14 to the booster circuit 13.

Figure 3:
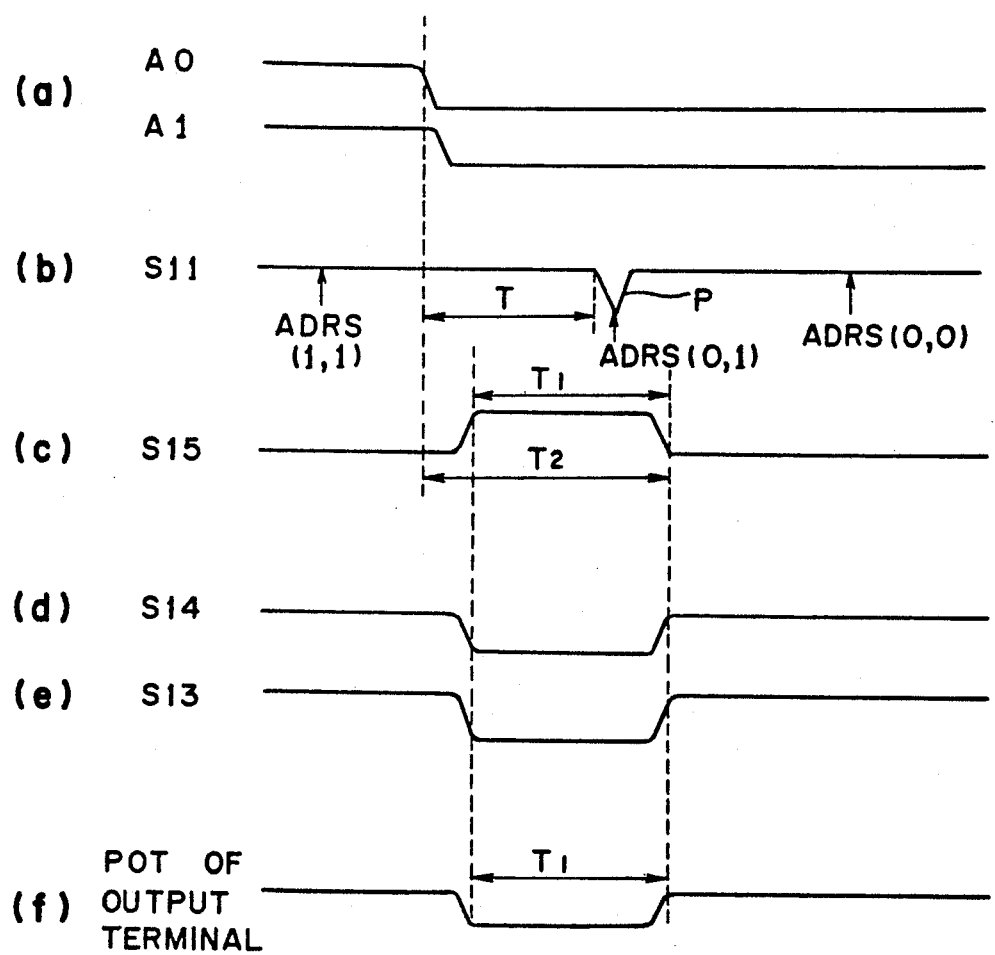
FIG. 3 is a timing chart showing a relationship between address signals and each of signals generated in the buffer device of FIG. 2.
Figure 4:
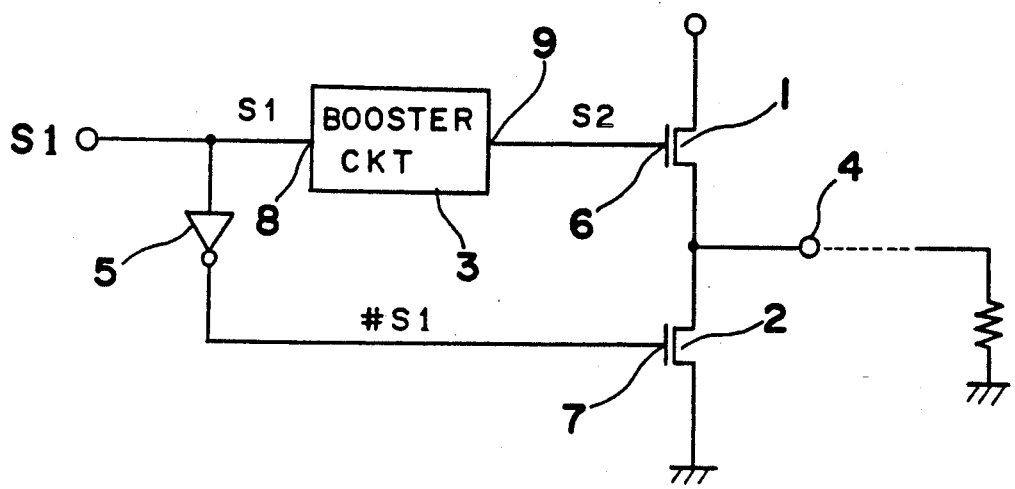
FIG. 4 is a diagram of a prior art buffer device.
Figure 5:
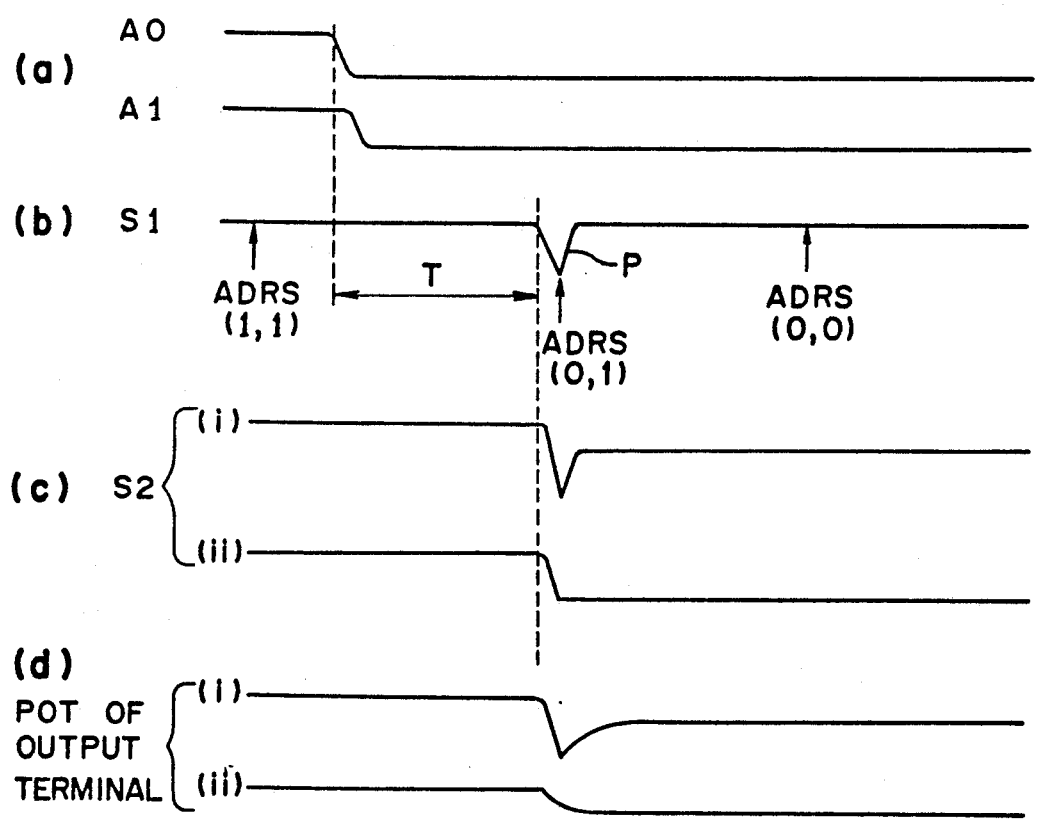
FIG. 5 is a timing chart showing a relationship between address signals and each of signals generated in the prior buffer device of FIG. 4.

The address transition signal output circuit 15 outputs the address transition signal S15 of a HIGH level for a specified time T1, as shown in FIG. 3 (c), when the transition of input address signal A0 or A1 is detected.

The buffer device as described above functions as follows. It is assumed that data stored in the data memory area of the semiconductor memory device has a value of 1 at address (1,1), 0 at address (0,1), and 1 at address (0,0). The data (value=1) stored at addresses (1,1) and (0,0) in this semiconductor memory device will be sequentially read and outputted from the output terminal 12.

FIG. 3 is a timing chart of the signals at each component in FIG. 2. The operation of the buffer device in the semiconductor memory device is described with reference to this timing chart.

First, as shown in FIG. 3 (a), when address signals A0 and A1 are both HIGH, the data "1" is read from address (1,1), and a HIGH data signal S11, as shown in FIG. 3 (b), corresponding to the data value "1" is inputted to the buffer device. The level of this data signal S11 is then inverted to a LOW level by the inverter 25, and a LOW signal #S11 is inputted to the NOR gate 24 and the input terminal 21 of the pull-down transistor 19. It is to be noted that the address transition signal S15 inputted to the NOR gate 24 from the address transition signal output circuit 15 at this time is LOW as shown in FIG. 3 (c). Therefore, the NOR gate 24 inverts the LOW signal #S11 inputted from the inverter 25, and outputs a signal S14 of a HIGH level as shown in FIG. 3 (d). A HIGH signal S14 corresponding to the output data "1" read from address (1,1) is thus outputted from the NOR gate 24 as the signal S14.

The signal S14 of a HIGH level outputted from the NOR gate 24 is inputted to the input terminal 22 of the booster circuit 13. The booster circuit 13 then outputs a HIGH signal S13 boosted to a predetermined boost level as shown in FIG. 3 (e). The boosted HIGH signal S13 is therefore inputted to the input terminal 20 of the pull-up transistor 18. Also, a LOW signal #S11 is inputted to the input terminal 21 of the pull-down transistor 19 as described above. As a result, the output terminal 12 of the buffer device is pulled up to the potential of the power supply input 17, becoming a HIGH level as shown in FIG. 3 (f).

It is next assumed that a skew occurs in the address signals when the address data changes from (1,1) to (0,0), and a LOW transient pulse P is inserted between the HIGH data signal S11 corresponding to the data "1" read from address (1,1) and the HIGH data signal S11 corresponding to the data "1" read from address (0,0) as shown in FIG. 3 (b).

When as shown in FIG. 3 (a), one A0 of the address signals A0 and A1 inputted to the address transition signal output circuit 15 is changed, the address transition signal output circuit 15 outputs a HIGH address transition signal S15 for the specified time period T1 as shown in FIG. 3 (c). Thus, the NOR gate 24 to which this HIGH address transition signal S15 is inputted outputs a LOW precharge signal as signal S14 for the same time period T1. This period T1 is also referred to as a precharge period below. This LOW precharge signal is then inputted to the input terminal 22 of the booster circuit 13 as shown in FIG. 3 (d). As a result, the booster circuit 13 stops the boost operation and outputs a signal S13 of a LOW level from the output terminal 23 for the period T1 as shown in FIG. 3 (e). In other words, the booster circuit 13 is held in a precharge state during the period T1.

When both address signals A0, A1 become LOW and specify the correct address (0,0), the data signal S11 changes to a HIGH level corresponding to the data "1" read from address (0,0) as shown in FIG. 3 (b). Because the booster circuit 13 has been sufficiently charged due to the precharge operation as described above, the signal inputted in the booster circuit 13 is quickly reboosted to the predetermined boost level by the booster circuit 13 as shown in FIG. 3 (e).

For the output signal S13 from the booster circuit 13 to be reboosted to the predetermined boost level as described above, it is sufficient to set a time period T2, i.e., the time from transition of address signal A0 until the level of the address transition signal S15 changes to LOW, to a period required to mask the LOW pulse P inserted to the data signal S11 due to address skewing. Furthermore, the precharge period T1 must only be as long as the time required to precharge the booster circuit 13.

As thus described, when the HIGH data signal corresponding to the data "1" read from the address (0,0) is inputted to the buffer device in the semiconductor memory device, the booster circuit 13 inputs to the pull-up transistor input terminal 20 a signal S13 sufficiently boosted to the predetermined boost level. Therefore, the output terminal 12 of the buffer device and therefore of the semiconductor memory device is charged up to the specified level corresponding to the data "1" read from address (0,0).

At this time, a LOW pulse of a duration equivalent to the precharge period T1 is inserted between the HIGH level corresponding to the data "1" stored at address (1,1) and the HIGH level corresponding to the data "1" stored at address (0,0), causing the potential of the output terminal 12 to drop for the time period T1 as shown in FIG. 3 (f). Therefore, the length of the inserted LOW pulse (i.e., the length of the precharge period T1) is, in addition to the conditions defined above, set to a period shorter than the cycle at which a next device attempts to read data from the output terminal 12 of the buffer device. As a result, the next device can read the correct data only.

According to the embodiment, if address data is changed from (1,1) to (1,0) or (0,1), namely, if only one of the address signals A0 and A1 is changed, the signal S14 from the NOR gate 24 is kept at a LOW level after the time period T2 lapses, because after the time period T2 lapses, the signal S15 changes to LOW and the signal #S11 is HIGH in this case. As a result, the signal S13 of a LOW level keeps being outputted from the booster circuit 13.

As obvious from the above, according to the buffer device of the present embodiment, even after a skew occurs in the address signals and a LOW transient pulse is disadvantageously inserted in the HIGH data signal, a good boost operation by the booster circuit 13 is secured, so that a well boosted signal is inputted to the pull-up transistor 18 and the output terminal of the semiconductor memory device incorporating the buffer device can be rapidly charged up to the specified potential.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A buffer device to be incorporated in a semiconductor memory device wherein data read from an address specified by an address signal is outputted from an output terminal of the buffer device, comprising:
    an address transition signal output circuit for detecting transition of an address signal and outputting an address transition signal of a predetermined level when the transition is detected;
    a switching circuit which receives both output from the address transition signal output circuit and a signal corresponding to a data signal indicative of data read from an address specified by said address signal, and outputs a precharge signal of a specified time length when the address transition signal is inputted from the address transition signal output circuit, and outputs the data signal when the address transition signal is not inputted;

a booster circuit connected with the switching circuit for receiving output from the switching circuit to boost a data signal having a HIGH voltage value to a predetermined voltage level greater than the HIGH voltage level, and output a booster data signal, wherein said booster circuit stops the boost operation and is precharged when the precharge signal is inputted from the switching circuit to the booster circuit; and a transistor circuit connected with the booster circuit for bringing, in response to output from the booster circuit, an electric potential of said output terminal of the buffer device to a specified high or low level in accordance with the output from the booster circuit.

2. The buffer device as claimed in claim 1, further comprising an inverter for inverting a data signal indicative of data read from an address so that an inverted data signal is inputted to the switching circuit.

3. The buffer device as claimed in claim 1, wherein the switching circuit is constituted from a NOR gate.

4. A buffer device to be incorporated in a semiconductor memory device wherein data read from an address specified by an address signal is outputted from an output terminal of the buffer device, comprising:

an address transition signal output circuit for detecting transition of an address signal and outputting an address transition signal of a predetermined level when the transition is detected;

a switching circuit which receives both output from the address transition signal output circuit and a signal corresponding to a data signal indicative of data read from an address specified by said address signal, and outputs a precharge signal of a specified time length when the address transition signal is inputted from the address transition signal output circuit, and outputs the data signal when the address transition signal is not inputted;

a booster circuit connected with the switching circuit for receiving output from the switching circuit to boost said data signal to a predetermined level when the data signal is HIGH, and output a boosted data signal, wherein said booster circuit stops the boost operation and is precharged when the precharge signal is inputted from the switching circuit to the booster circuit; and a transistor circuit, connected with the booster circuit and including a first transistor for connecting the output terminal of the buffer device to a power source and a second transistor for connecting the output terminal of the buffer device to a ground, a gate electrode of said first transistor is connected with the booster circuit so that output from the booster circuit is inputted to the gate electrode, while the signal corresponding to the data signal is inputted to a gate electrode of the second transistor, for bringing in response to output from the booster circuit, an electric potential of said output terminal of the buffer device to a specified high or low level in accordance with the output from the booster circuit.

5. The buffer device as claimed in claim 1, wherein the time length of the precharge signal is set to a time length which is enough to precharge the booster circuit and which is shorter than a cycle at which data is outputted from the output terminal of the buffer device.

6. A buffer circuit including at least one terminal for receiving data read from a location in a memory specified by a memory address signal and at least one output terminal and preventing unstable buffer operation during memory address signal transitions, comprising:

means for detecting a change in the address signal and generating an address transition signal;

a selector including:

means for transmitting an addressed data signal and for temporarily interrupting the data signal upon receiving the address transition signal and generating a preset charging signal;

means for increasing the voltage level of the data signal during first time periods when the data signal is received from the data signal transmitting means;

means for charging the increasing means during second time periods when the charging signal is received; and switch means for varying electric potential of the buffer circuit output terminal in response to the data signal received from the booster circuit.

7. The buffer circuit according to claim 6, further comprising:

an inverter to generate an inverted data signal as an input to the selector.

8. The buffer circuit according to claim 6, wherein the switch means includes a NOR gate.

9. The buffer circuit according to claim 6, wherein the switch means includes a first transistor for connecting the buffer output terminal to a power source and a second transistor for connecting the buffer output terminal to ground, wherein a gate electrode of the first transistor receives data signals from the booster circuit while a gate electrode of the second transistor receives inverted data signals.

10. The buffer circuit according to claim 6, wherein the second time periods allow the increasing means to be substantially charged but are shorter than the time required to generate a data signal at the buffer output terminal.

* * * * *